United States Patent
Moon et al.

(10) Patent No.: US 9,773,756 B2
(45) Date of Patent: Sep. 26, 2017

(54) SEMICONDUCTOR PACKAGES INCLUDING MOLDED STACKED DIE WITH TERRACE-LIKE EDGES

(71) Applicant: SK hynix Inc., Icheon-si Gyeonggi-do (KR)

(72) Inventors: Jong Kyu Moon, Namyangju-si (KR); Jong Won Kim, Yongin-si (KR); Wan Choon Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/081,005

(22) Filed: Mar. 25, 2016

(65) Prior Publication Data

US 2017/0154872 A1   Jun. 1, 2017

(30) Foreign Application Priority Data

Nov. 26, 2015 (KR) .................... 10-2015-0166788

(51) Int. Cl.
*H01L 21/00* (2006.01)
*H01L 25/065* (2006.01)
*H01L 23/31* (2006.01)

(52) U.S. Cl.
CPC ...... *H01L 25/0657* (2013.01); *H01L 23/3107* (2013.01); *H01L 2224/16145* (2013.01); *H01L 2224/16225* (2013.01); *H01L 2224/32145* (2013.01); *H01L 2224/73204* (2013.01); *H01L 2225/06513* (2013.01);
(Continued)

(58) Field of Classification Search
CPC ............... H01L 21/00; H01L 21/67121; H01L 23/3107; H01L 25/0657; H01L 2924/181; H01L 2225/065082; H01L 2224/16225; H01L 2224/32145; H01L 2224/73204; H01L 2924/15159; H01L 2924/15174; H01L 2924/15311; H01L 2924/18161; H01L 2224/16145; H01L 2225/06555; H01L 2225/065
See application file for complete search history.

(56) References Cited

U.S. PATENT DOCUMENTS

| 5,334,874 A * | 8/1994 | Metzler ............. H01L 21/67121 257/678 |
| 5,597,074 A | 1/1997 | Ko |
| 2015/0228591 A1 * | 8/2015 | Kim ........................ H01L 24/17 257/692 |

* cited by examiner

*Primary Examiner* — Charles Garber
*Assistant Examiner* — Abdulfattah Mustapha
(74) *Attorney, Agent, or Firm* — William Park & Associates Ltd.

(57) ABSTRACT

A semiconductor package may include a first semiconductor die, external connectors, second semiconductor dies, a mold layer, an outer packaging part, and a terrace-like edge. The external connectors may be disposed over a first surface of the first semiconductor die. The second semiconductor dies may be stacked over a second surface of the first semiconductor die. The mold layer may cover sidewalls of the second semiconductor dies. The outer packaging part may have a groove in which a stack structure of the first and second semiconductor dies are accommodated. The terrace-like edge may be disposed under an edge of the mold layer to expose a sidewall of the first semiconductor die. A portion of an outer sidewall of the mold layer may be in contact with a portion of an inner surface of the outer packaging part, and the inner surface of the outer packaging part may be spaced apart from the sidewall of the first semiconductor die by the terrace-like edge.

19 Claims, 11 Drawing Sheets

(52) U.S. Cl.
CPC ........... *H01L 2225/06541* (2013.01); *H01L 2225/06555* (2013.01); *H01L 2225/06582* (2013.01); *H01L 2924/15159* (2013.01); *H01L 2924/15174* (2013.01); *H01L 2924/15311* (2013.01); *H01L 2924/181* (2013.01); *H01L 2924/18161* (2013.01)

SEMICONDUCTOR PACKAGES INCLUDING MOLDED STACKED DIE WITH TERRACE-LIKE EDGES

CROSS-REFERENCE TO RELATED APPLICATIONS

The present application claims priority under 35 U.S.C 119(a) to Korean Patent Application No. 10-2015-0166788 filed on Nov. 26, 2015, which is incorporated herein by references in its entirety.

BACKGROUND

1. Technical Field

Embodiments of the present disclosure generally relate to semiconductor packages and, more particularly, to semiconductor packages including molded stacked die with terrace-like edges.

2. Related Art

In the electronics industry, a single unified package including a plurality of semiconductor dies or a plurality of semiconductor chips is increasingly in demand with the development of faster, large-capacity, miniaturized semiconductor packages. If the single unified packages are employed in electronic systems, sizes of the electronic systems may be reduced and lengths of signal transmission paths in the electronic systems may also be reduced. In the event that the single unified package includes a plurality of semiconductor dies therein, a portion of the plurality of semiconductor dies may be exposed at a surface of the single, unified package in order to effectively dissipate heat from the semiconductor dies through the single unified package.

When at least two semiconductor packages are combined with each other to realize a high-level semiconductor package such as a system-in-package (SIP), a stack structure of a plurality of semiconductor dies may be required to provide a portion of the SIP. In such a case, the stack structure of the plurality of semiconductor dies may be realized without any printed circuit board (PCB), and a portion of the stack structure of the plurality of semiconductor dies may be exposed at a surface of the SIP.

If a portion of a semiconductor die is exposed at a surface of a semiconductor package, an external shock applied to the exposed portion of the semiconductor die or a physical contact with an external member may cause mechanical damage such as chipping defects. The chipping defects may generate particles that may cause an additional failure. Accordingly, a stack structure of semiconductor dies for suppressing the chipping may be required to realize the high-level semiconductor package such as the SIP.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
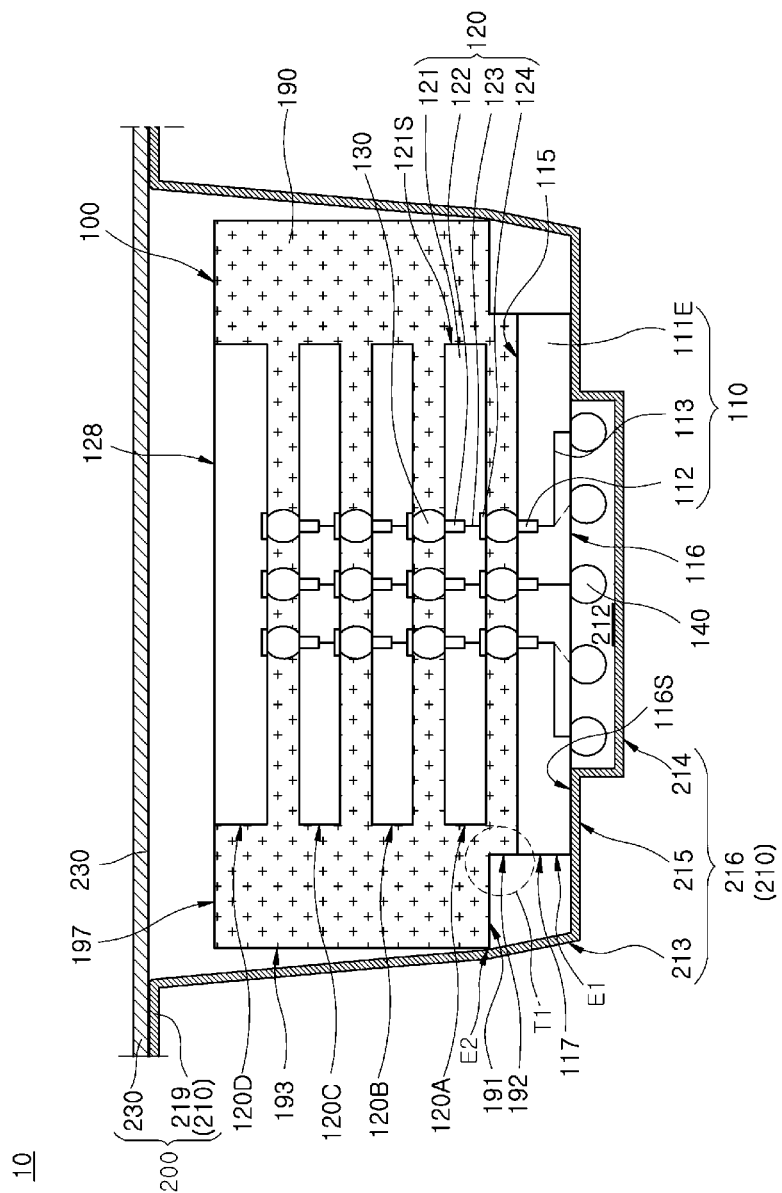
FIG. 1 is a cross-sectional view illustrating an example of a semiconductor package according to an embodiment.

According to an embodiment, a semiconductor package may include a first semiconductor die, external connectors, second semiconductor dies, a mold layer, an outer packaging part, and a terrace-like edge. The external connectors may be disposed over a first surface of the first semiconductor die. The second semiconductor dies may be stacked over a second surface of the first semiconductor die. The mold layer may cover sidewalls of the second semiconductor dies. The outer packaging part may have a groove in which a stack structure of the first and second semiconductor dies are accommodated. The terrace-like edge may be disposed under an edge of the mold layer to expose a sidewall of the first semiconductor die. A portion of an outer sidewall of the mold layer may be in contact with a portion of an inner surface of the outer packaging part, and the inner surface of the outer packaging part may be spaced apart from the sidewall of the first semiconductor die by the terrace-like edge.

According to an embodiment, a semiconductor package may include a first semiconductor die, external connectors, external connectors, a mold layer, and a terrace-like edge. The external connectors may be disposed over a first surface of the first semiconductor die. The second semiconductor dies may be stacked over a second surface of the first semiconductor die. The mold layer may cover sidewalls of the second semiconductor dies. The terrace-like edge may be disposed under an edge of the mold layer to expose a sidewall of the first semiconductor die.

According to an embodiment, a semiconductor package may include a first semiconductor die, external connectors, second semiconductor dies, a mold layer. The external connectors may be disposed over a first surface of the first semiconductor die. The second semiconductor dies may be stacked over a second surface of the first semiconductor die. The mold layer may cover sidewalls of the second semiconductor dies. A sidewall of the first semiconductor die is offset toward a central portion of the first semiconductor die compared to an outer sidewall of the mold layer.

According to an embodiment, there is provided a memory card including a semiconductor package. The semiconductor package may include a first semiconductor die, external connectors, second semiconductor dies, a mold layer, an outer packaging part, and a terrace-like edge. The external connectors may be disposed over a first surface of the first semiconductor die. The second semiconductor dies may be stacked over a second surface of the first semiconductor die. The mold layer may cover sidewalls of the second semiconductor dies. The outer packaging part may have a groove in which a stack structure of the first and second semiconductor dies are accommodated. The terrace-like edge may be disposed under an edge of the mold layer to expose a sidewall of the first semiconductor die. A portion of an outer sidewall of the mold layer may be in contact with a portion of an inner surface of the outer packaging part, and the inner surface of the outer packaging part may be spaced apart from the sidewall of the first semiconductor die by the terrace-like edge.

According to an embodiment, there is provided a memory card including a semiconductor package. The semiconductor package may include a first semiconductor die, external connectors, external connectors, a mold layer, and a terrace-like edge. The external connectors may be disposed over a first surface of the first semiconductor die. The second semiconductor dies may be stacked over a second surface of the first semiconductor die. The mold layer may cover sidewalls of the second semiconductor dies. The terrace-like edge may be disposed under an edge of the mold layer to expose a sidewall of the first semiconductor die.

According to an embodiment, there is provided a memory card including a semiconductor package. The semiconductor package may include a first semiconductor die, external connectors, second semiconductor dies, a mold layer. The external connectors may be disposed over a first surface of the first semiconductor die. The second semiconductor dies may be stacked over a second surface of the first semiconductor die. The mold layer may cover sidewalls of the second semiconductor dies. A sidewall of the first semiconductor die is offset toward a central portion of the first semiconductor die compared to an outer sidewall of the mold layer.

According to an embodiment, there is provided an electronic system including a semiconductor package. The semiconductor package may include a first semiconductor die, external connectors, second semiconductor dies, a mold layer, an outer packaging part, and a terrace-like edge. The external connectors may be disposed over a first surface of the first semiconductor die. The second semiconductor dies may be stacked over a second surface of the first semiconductor die. The mold layer may cover sidewalls of the second semiconductor dies. The outer packaging part may have a groove in which a stack structure of the first and second semiconductor dies are accommodated. The terrace-like edge may be disposed under an edge of the mold layer to expose a sidewall of the first semiconductor die. A portion of an outer sidewall of the mold layer may be in contact with a portion of an inner surface of the outer packaging part, and the inner surface of the outer packaging part may be spaced apart from the sidewall of the first semiconductor die by the terrace-like edge.

According to an embodiment, there is provided an electronic system including a semiconductor package. The semiconductor package may include a first semiconductor die, external connectors, external connectors, a mold layer, and a terrace-like edge. The external connectors may be disposed over a first surface of the first semiconductor die. The second semiconductor dies may be stacked over a second surface of the first semiconductor die. The mold layer may cover sidewalls of the second semiconductor dies. The terrace-like edge may be disposed under an edge of the mold layer to expose a sidewall of the first semiconductor die.

According to an embodiment, there is provided an electronic system including a semiconductor package. The semiconductor package may include a first semiconductor die, external connectors, second semiconductor dies, a mold layer. The external connectors may be disposed over a first surface of the first semiconductor die. The second semiconductor dies may be stacked over a second surface of the first semiconductor die. The mold layer may cover sidewalls of the second semiconductor dies. A sidewall of the first semiconductor die is offset toward a central portion of the first semiconductor die compared to an outer sidewall of the mold layer.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips or the semiconductor dies may correspond to memory chips or logic chips (including application specific integrated circuits (ASIC) chips). The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIGS. 1 to 5 illustrate examples of a semiconductor package 10 including a side molded stacked die 100.

Referring to FIG. 1, the semiconductor package 10 may include the side molded stacked die 100 and an outer packaging part 200 accommodating the side molded stacked die 100. The side molded stacked die 100 may include semiconductor dies 110 and 120 that are stacked and a mold layer 190 that covers sidewalls of the semiconductor dies 110 and 120. For example, the semiconductor dies 110 and 120 may be stacked on top of one another. In an embodiment, the semiconductor dies 120 stacked on top of one another interleaved with insulating layers may be disposed over the semiconductor die 110. Accordingly, the side molded stacked die 100 may be provided in a form of a semiconductor package. The outer packaging part 200 may act as a packaging member that protects the side molded stacked die 100 from external shocks. The outer packaging part 200 may be a tray that accommodates the side molded stacked die 100. In an embodiment, the outer packaging part 200 may be a portion of a packaging member having a tape and reel format.

Figure 2:
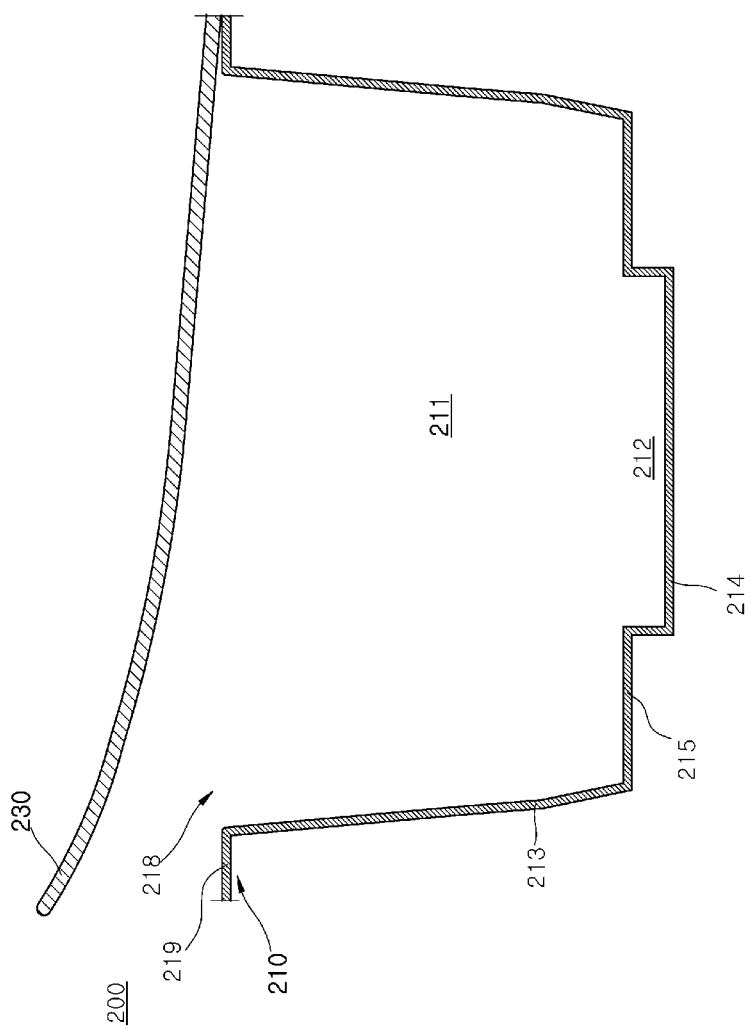
FIG. 2 is a cross-sectional view illustrating an example of a packaging part included in a semiconductor package according to an embodiment.

Referring to FIGS. 1 and 2, the outer packaging part 200 may include a carrier tape 210 providing an accommodating groove 211 and 212 in which the side molded stacked die 100 is put. The accommodating groove 211 and 212 provided by the carrier tape 210 may include a second space 211 in which a body of the side molded stacked die 100 is put and a first space 212 in which external connectors 140 of the side molded stacked die 100 are put. The second space 211 may be located over the first space 212. Accordingly, the carrier tape 210 may be a member accommodating the side molded stacked die 100. That is, the carrier tape 210 may encapsulate the side molded stacked die 100 and may protect the side molded stacked die 100 when the side molded stacked die 100 is transferred to a desired place.

The carrier tape 210 may include a connector housing 214 having a nest shape to provide the first space 212 in which the external connectors 140 are put, a die supporting portion 215 horizontally extending from the connector housing 214, and a sidewall portion 213 vertically extending from edges of the die supporting portion 215 to provide the second space 211 in which the body of the side molded stacked die 100 is put. An upper portion of the sidewall portion 213 may horizontally and outwardly extends to provide an adhesive portion 219, and a cover tape 230 may be attached to the adhesive portion 219. The cover tape 230 may be attached to the adhesive portion 219 to act as a lid that seals the accommodating groove 211 and 212.

Figure 3:
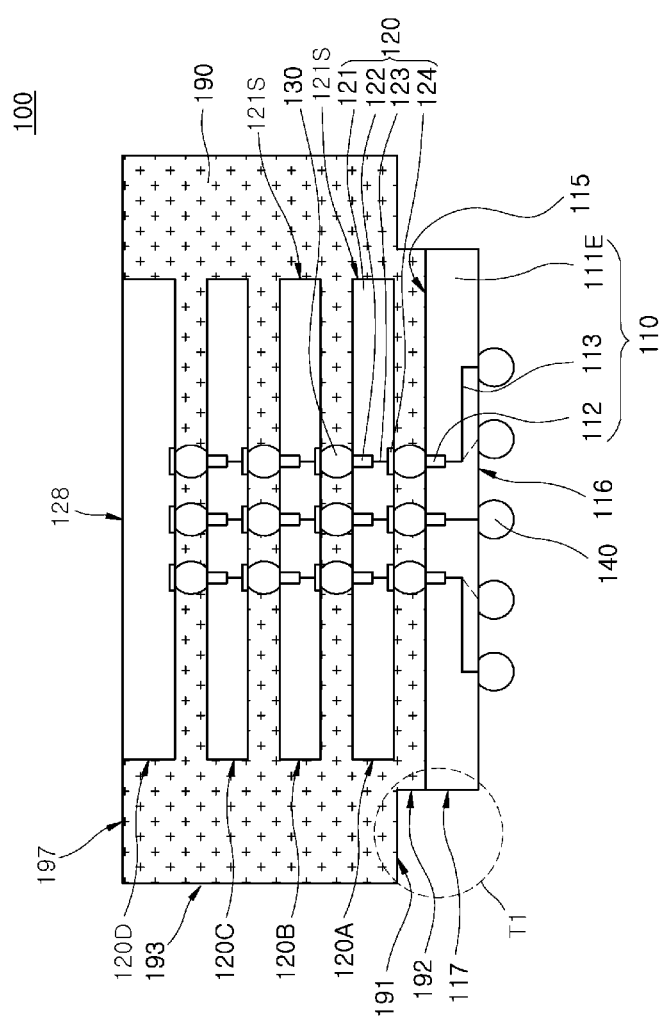
FIG. 3 is a cross-sectional view illustrating an example of a side molded stacked die included in the semiconductor package of FIG. 1.

Referring to FIGS. 1 and 3, the side molded stacked die 100 disposed in the accommodating groove 211 and 212 provided by the carrier tape 210 may include the plurality of semiconductor dies 110 and 120 which are vertically stacked. The plurality of semiconductor dies 110 and 120 may be electrically connected to each other via electrodes 112 and 122 that penetrate the plurality of semiconductor dies 110 and 120. The electrodes 112 and 122 may be disposed to substantially penetrate semiconductor substrates corresponding to bodies of the plurality of semiconductor dies 110 and 120 in which transistors are integrated. The electrodes 112 and 122 may be through-silicon vias (TSVs) penetrating silicon substrates corresponding to the semiconductor substrates of the plurality of semiconductor dies 110 and 120.

The side molded stacked die 100 may include a first semiconductor die 110 and a second semiconductor die 120 vertically stacked on the first semiconductor die 110. The first semiconductor die 110 may have a width greater than a width of the second semiconductor die 120 stacked over the first semiconductor die 110. Thus, edges 111E of the first semiconductor die 110 may laterally protrude from sidewalls 121S of the second semiconductor die 120. Since the edges 111E of the first semiconductor die 110 laterally protrudes from the sidewalls 121S of the second semiconductor die 120, sidewalls 117 of the first semiconductor die 110 may be located farther than the sidewalls 121S of the second semiconductor die 120 from a central portion of the second semiconductor die 120.

The first semiconductor die 110 may have a different function from a function of the second semiconductor die 120. The second semiconductor die 120 may include a plurality of semiconductor dies vertically stacked over the first semiconductor die 110. For example, the plurality of semiconductor dies may be stacked on top of one another interleaved with insulating layers. The plurality of semiconductor dies constituting the second semiconductor die 120 may have the same or substantially the same function as one another. A stack structure of the first semiconductor die 110 and the second semiconductor die 120 may constitute a single memory semiconductor device, for example, a high bandwidth memory (HBM) device.

The second semiconductor die 120 may include a memory device for storing data, for example, a DRAM device. The second semiconductor die 120 may include a memory core comprised of memory cell arrays. The first semiconductor die 110 may be a master die or a master chip that controls an operation of the second semiconductor die 120. The first semiconductor die 110 may include an input/output (I/O) interface circuit for communicating with an external device such as a graphic processing unit (GPU) or a central processing unit (CPU) and for controlling the memory cores included in the second semiconductor die 120, a logic circuit for repairing the memory cores included in the second semiconductor die 120, and a test circuit for testing an operation of the second semiconductor die 120.

The second semiconductor die 120 may include a first die 120A, a second die 120B, a third die 120C and a fourth die 120D which are stacked over the first semiconductor die 110. The operations of the first, second, third and fourth dies 120A, 120B, 120C and 120D may be controlled by the first semiconductor die 110. For example, a write operation or a read operation of any one of the first to fourth dies 120A, 120B, 120C and 120D may be executed according to control signals outputted from the first semiconductor die 110 acting as a master chip. If the first, second, third and fourth dies 120A, 120B, 120C and 120D are flash memory devices, a program operation, a read operation or an erasure operation of any one of the first to fourth dies 120A, 120B, 120C and 120D may be executed according to control signals outputted from the first semiconductor die 110 acting as a master chip. The control signals and data may be transmitted from the first semiconductor die 110 to the second semiconductor dies 120A, 120B, 120C, and 120D via the electrodes 112 and 122. Each of the second semiconductor dies 120A, 120B, 120C and 120D may include a memory core and the memory core may be controlled by the first semiconductor die 110. In such a case, each of the second semiconductor dies 120A, 120B, 120C and 120D may be designed without a peripheral circuit such as an address generation circuit for selecting a certain memory cells in the memory core.

As illustrated in FIG. 3, the second semiconductor dies 120A, 120B, 120C, and 120D may be vertically stacked over the first semiconductor die 110. The second semiconductor dies 120A, 120B, 120C, and 120D may be stacked so that the sidewalls 121S of the second semiconductor dies 120A, 120B, 120C, and 120D are aligned with each other. Although FIG. 3 illustrates an example in which the second semiconductor die 120 includes four stacked dies to realize a HBM device, the present disclosure is not limited thereto. For example, the number of the dies constituting the second semiconductor die 120 may be five or more.

Figure 4:
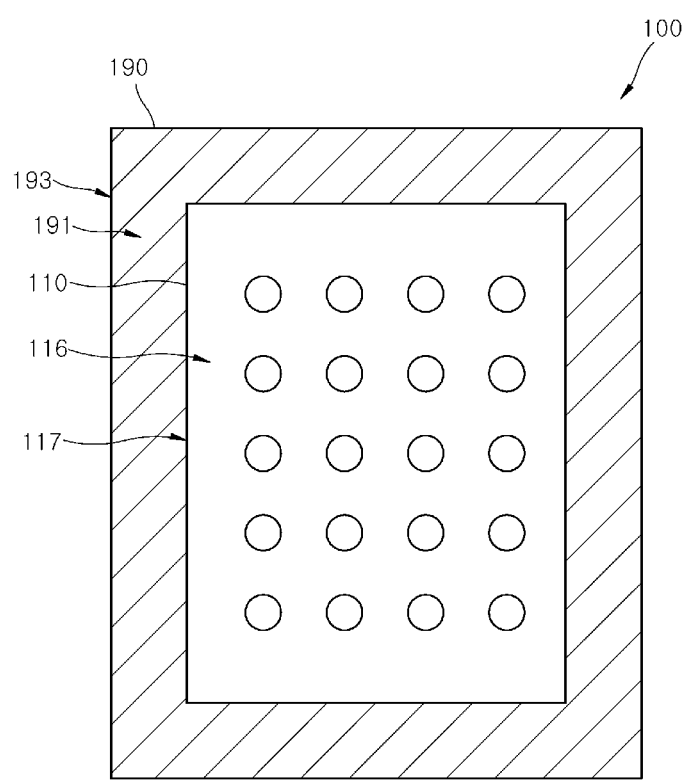
FIG. 4 is a bottom plan view illustrating an example of a side molded stacked die included in the semiconductor package of FIG. 1.

The first semiconductor die 110 may include the external connectors 140 for connecting the side molded stacked die 100 to an external device. The external connectors 140 may be disposed on a first surface 116 of a body of the first semiconductor die 110. Each of the external connectors 140 may be a conductive bump or a solder ball. The first semiconductor die 110 may include the first electrodes 112, which connect the first semiconductor die 110 to the second semiconductor die 120, and first inner interconnection lines 113, which connect the first electrodes 112 to the external connectors 140. The first electrodes 112 may be disposed in a portion of the first semiconductor die 110. In contrast, the external connectors 140 may be uniformly disposed on an entire surface of the first surface 116 of the first semiconductor die 110, as illustrated in FIG. 4. The first inner interconnection lines 113 may be disposed to electrically connect the first electrodes 112 to the external connectors 140.

The second semiconductor die 120 may be disposed over a second surface 115 of the first semiconductor die 110 opposite to the external connectors 140, and the first to fourth dies 120A, 120B, 120C, and 120D constituting the second semiconductor die 120 may be electrically connected to the first electrodes 112 of the first semiconductor die 110 by inner connectors 130 disposed between the first to fourth dies 120A, 120B, 120C, and 120D as well as between the first semiconductor die 110 and the first die 120A. The inner connectors 130 may be micro bumps that connect the first electrodes 112 of the first semiconductor die 110 to conductive contact pads 124 disposed on a surface of the first die 120A. The first die 120A may further include second inner interconnection lines 123 that connect the second electrodes 122 to the conductive contact pads 124. Each of the second, third, and fourth dies 120B, 120C, and 120D may also have the same or substantially the same configuration as the first die 120A.

The side molded stacked die 100 may include the mold layer 190 covering the sidewalls 121S of the first to fourth dies 120A, 120B, 120C, and 120D stacked over the second surface 115 of the first semiconductor die 110. For example, the first to fourth dies 120A, 120B, 120C, and 120D stacked on top of one another may be interleaved with the mold layer 190. The mold layer 190 may be an insulation layer such as a silica material or an epoxy material. For example, the mold layer 190 may be an epoxy molding compound (EMC) material that is formed to cover the sidewalls 121S of the first to fourth dies 120A, 120B, 120C, and 120D using a molding process. The mold layer 190 may extend to fill spaces between the first semiconductor die 110 and the first to fourth dies 120A, 120B, 120C, and 120D. In some embodiments, an adhesive insulation material (not illustrated) may be disposed between the first semiconductor die 110 and the first to fourth dies 120A, 120B, 120C, and 120D to improve an adhesive strength between the first semiconductor die 110 and the first to fourth dies 120A, 120B, 120C and 120D.

The mold layer 190 may cover the sidewalls 121S of the first to fourth dies 120A, 120B, 120C, and 120D to expose a top surface 128 of the fourth die 120D corresponding to an uppermost die of the first to fourth dies 120A, 120B, 120C, and 120D. That is, a top surface 197 of the mold layer 190 may be coplanar with the top surface 128 of the fourth die 120D. In such a case, heat generated in the side molded stacked die 100 may be easily emitted through the exposed top surface 128 of the fourth die 120D. If the second semiconductor die 120 includes a plurality of stacked dies as illustrated in FIG. 3, the exposed top surface 128 of the fourth die 120D may effectively dissipate heat from the side molded stacked die 100.

Referring again to FIGS. 1 and 3, the mold layer 190 may be disposed to expose the sidewalls 117 of the first semiconductor die 110. Outer sidewalls 193 of the mold layer 190 may be substantially parallel with the sidewalls 121S of the first to fourth dies 120A, 120B, 120C, and 120D. A distance between a vertical axis (not illustrated) passing through a central portion of the side molded stacked die 100 and the outer sidewalls 193 of the mold layer 190 may be greater than a distance between the vertical axis (not illustrated) passing through a central portion of the side molded stacked die 100 and the sidewalls 117 of the first semiconductor die 110. Thus, the mold layer 190 may have horizontal surfaces 191 that extend from lower portions of the outer sidewalls 193 of the mold layer 190 toward the sidewalls 117 of the first semiconductor die 110. Accordingly, the outer sidewalls 193 of the mold layer 190, the horizontal surfaces 191 of the mold layer 190, and the sidewalls 117 of the first semiconductor die 110 may constitute terrace-like edges T1. As illustrated in FIG. 4, the horizontal surfaces 191 of the mold layer 190 may not overlap with the first semiconductor die 110. Thus, the horizontal surfaces 191 of the mold layer 190 may be exposed when viewed from a bottom plan view.

The horizontal surfaces 191 of the mold layer 190 may be located at a different level from a level of the second surface 115 of the first semiconductor die 110. For example, the horizontal surfaces 191 of the mold layer 190 may be located at a higher level than a level of the second surface 115 of the first semiconductor die 110. In such a case, the mold layer 190 may have inner sidewalls 192 vertically and upwardly extending from the sidewalls 117 of the first semiconductor die 110 to contact the horizontal surfaces 191 of the mold layer 190. Accordingly, the inner sidewalls 192 of the mold layer 190 may be located at positions that are laterally recessed from the outer sidewalls 193 of the mold layer 190 toward the vertical center axis (not illustrated) of the side molded stacked die 100. As a result, the outer sidewalls 193, the horizontal surfaces 191 and the inner sidewalls 192 of the mold layer 190 may provide the terrace-like edges T1 which are located at lower corners of the side molded stacked die 100.

Figure 5:
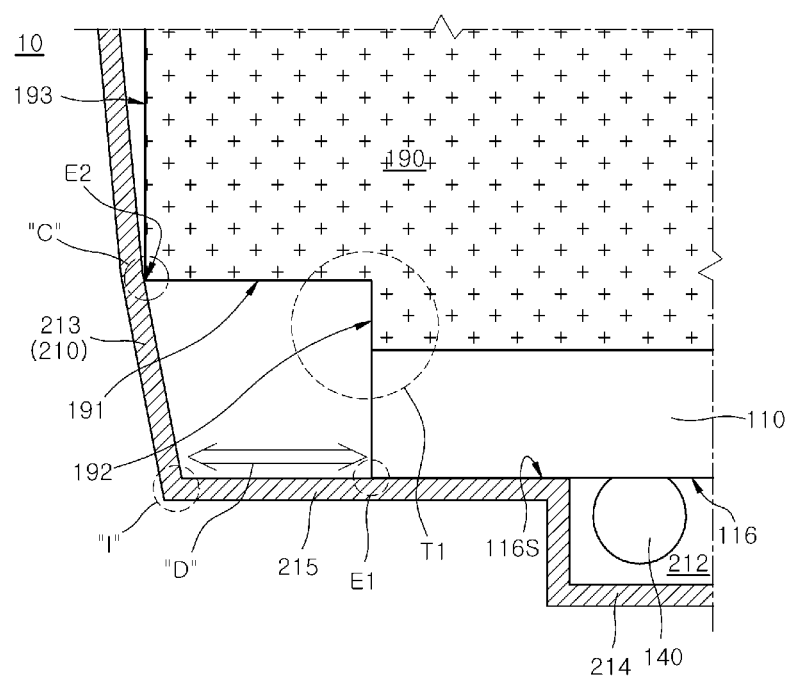
FIG. 5 is a cross-sectional view illustrating a portion of an example of a side molded stacked die and a portion of an example of a packaging part included in the semiconductor package of FIG. 1.

Referring to FIGS. 1 and 5, a portion of the outer sidewall 193 of the mold layer 190 may contact a portion "C" of an inner surface of the sidewall portion 213 of the outer packaging part 200. Specifically, a corner E2 at which the outer sidewall 193 and the horizontal surface 191 of the mold layer 190 meet and form an angle may be in contact with the inner surface of the sidewall portion 213 of the outer packaging part 200. In such a case, while edges 116S of the first surface 116 of the first semiconductor die 110 are in contact with the die supporting portion 215 of the outer packaging part 200, the sidewalls 117 of the first semiconductor die 110 may be spaced apart from the sidewall portion 213 of the outer packaging part 200. Thus, a corner E1 at which the first surface 116 and the sidewalls 117 of the first semiconductor die 110 meet and form an angle may be spaced apart from the sidewall portion 213 of the outer packaging part 200. A contact portion "I" at which the sidewall portion 213 and the die supporting portion 215 of the outer packaging part 200 (e.g., the carrier tape) meet and form an angle may be spaced apart from the sidewalls 117 of the first semiconductor die 110 and may also be spaced part from the horizontal surface 191 of the mold layer 190.

The corner E1 of the first semiconductor die 110 may be spaced apart from the contact portion "I" at which the sidewall portion 213 and the die supporting portion 215 of the carrier tape 210 meet and form an angle because of the presence of the terrace-like edges T1 of the side molded stacked die 100. That is, the terrace-like edges T1 of the side molded stacked die 100 may act as barriers or safeguards that prevent the corner E1 of the first semiconductor die 110 from being in contact with the contact portion "I." If the corner E1 of the first semiconductor die 110 is in contact with the die supporting portion 215 of the carrier tape 210 and the sidewall portion 213 of the carrier tape 210, a frictional force may be concentrated on the corner E1 of the first semiconductor die 110 when an external force is applied to the semiconductor package 10. That is, if both of the sidewall 117 and the first surface 116S of the first semiconductor die 110 are in contact with the inner surface of the carrier tape 210, a frictional force or a shock may be concentrated on the corner E1 of the first semiconductor die 110.

In the side molded stacked die including an HBM device, since the corners E1 and the sidewalls 117 of the first semiconductor die 110 are exposed by the mold layer 190, a frictional force or a shock may be directly transmitted to the corner E1 of the first semiconductor die 110. Thus, a peeling phenomenon may occur at the corner E1 of the first semiconductor die 110, or the corner E1 of the first semiconductor die 110 may be damaged and may cause particles. The corner E1 of the first semiconductor die 110 may include a silicon layer (not illustrated) and a passivation layer (not illustrated) which are stacked. Thus, the corner E1 of the first semiconductor die 110 may be easily damaged by a shock or a frictional force. However, according to an embodiment, the terrace-like edges T1 of the side molded stacked die 100 may prevent the corner E1 of the first semiconductor die 110 from being in contact with the contact portion "I" of the sidewall portion 213 and the die supporting portion 215 of the carrier tape 210. Thus, the terrace-like edges T1 of the side molded stacked die 100 may alleviate a frictional force or a shock concentrated on the corner E1 of the first semiconductor die 110 even if an external force or a shock is applied to the semiconductor package 10. Accordingly, the terrace-like edges T1 of the side molded stacked die 100 may reduce particle issues related to the damage of the corner E1 of the first semiconductor die 110.

The semiconductor package 10 employing the side molded stacked die 100 including the first semiconductor die 110 whose sidewalls 117 are exposed may be applied to various electronic systems. The side molded stacked die 100 may be provided in a form of a semiconductor package and may be used as a component of an electronic system, a semiconductor module or another type of semiconductor package. That is, the side molded stacked die 100 may be employed as one of a plurality of components constituting a portable product (e.g., a mobile phone or a display pad) or a system-in-package (SIP). Various semiconductor packages or various semiconductor devices may be combined with each other to realize the SIP. In such a case, it may be necessary to keep the side molded stacked die 100 acting as one of the various semiconductor packages or the various semiconductor devices in the outer packaging part 200 while the side molded stacked die 100 is transferred to a desired place. The terrace-like edges T1 of the side molded stacked die 100 may suppress or prevent the first semiconductor die 110 from being damaged or broken while the side molded stacked die 100 is transferred or kept with the outer packaging part 200.

Referring again to FIG. 1, the sidewalls 117 of the first semiconductor die 110 may be laterally recessed from the outer sidewalls 193 of the molding layer 190 toward a vertical center axis of the side molded stacked die 100. Thus, a contact area between the first semiconductor die 110 and the outer packaging part 200 may be reduced. As a result, when an external force is applied to the semiconductor package 10, a frictional force or a shock concentrated on the first semiconductor die 110 may be alleviated to prevent the first semiconductor die 110 from being damaged or to prevent particles from being generated.

Figure 6:
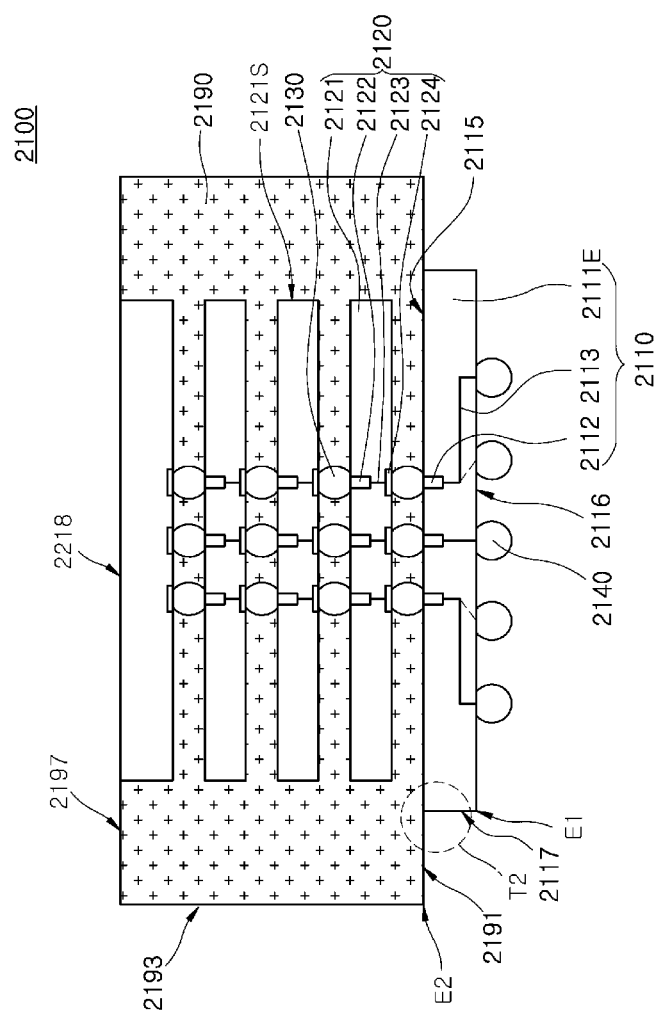
FIG. 6 is a cross-sectional view illustrating an example of a side molded stacked die included in a semiconductor package according to an embodiment.

FIG. 6 is a cross-sectional view illustrating an example of side molded stacked die 2100 included in a semiconductor package according to an embodiment.

Referring to FIG. 6, the side molded stacked die 2100 may be packaged by the carrier tape (210 of FIG. 1) of the outer packaging part (200 of FIG. 1) to provide a semiconductor package. The side molded stacked die 2100 may include a plurality of semiconductor dies 2110 and 2120 which are stacked. The plurality of semiconductor dies 2110 and 2120 may be electrically connected to each other by electrodes 2112 and 2122. For example, the electrodes 2112 and 2122 may be electrodes that pass through the semiconductor dies 2110 and 2120, respectively. The first semiconductor die 2110 may have a width greater than a width of the second semiconductor die 2120 stacked over the first semiconductor die 2110. Thus, edges 2111E of the first semiconductor die 2110 may laterally protrude from sidewalls 2121S of the second semiconductor die 2120.

The first semiconductor die 2110 may have a different function from a function of the second semiconductor die 2120. The second semiconductor die 2120 may include a plurality of semiconductor dies vertically stacked over the first semiconductor die 2110. For example, the plurality of semiconductor dies may be stacked on top of one another interleaved with insulating layers. The plurality of semiconductor dies constituting the second semiconductor die 2120 may have the same or substantially the same function as one another. A stack structure of the first semiconductor die 2110 and the second semiconductor die 2120 may constitute a single memory semiconductor device, for example, a high bandwidth memory (HBM) device.

The first semiconductor die 2110 may include the external connectors 2140 for connecting the side molded stacked die 2100 to an external device. The external connectors 2140 may be disposed on a first surface 2116 of a body of the first semiconductor die 2110. The first semiconductor die 2110 may include the first electrodes 2112, which connect the first semiconductor die 2110 to the second semiconductor die 2120, and first inner interconnection lines 2113, which connect the first electrodes 2112 to the external connectors

2140. The first electrodes 2112 may be disposed in a portion of the first semiconductor die 2110. In contrast, the external connectors 2140 may be uniformly disposed on an entire surface of the first surface 2116 of the first semiconductor die 2110, as described with reference to FIG. 4. The first inner interconnection lines 2113 may be disposed to electrically connect the first electrodes 2112 to the external connectors 2140.

The second semiconductor die 2120 may be disposed over a second surface 2115 of the first semiconductor die 2110 opposite to the external connectors 2140, and the plurality of dies constituting the second semiconductor die 2120 may be electrically connected to the first electrodes 2112 of the first semiconductor die 2110 by inner connectors 2130 disposed between the plurality of dies constituting the second semiconductor die 2120 as well as between the first semiconductor die 2110 and the second semiconductor die 2120. Examples of the inner connectors 2130 may include micro bumps that connect the first electrodes 2112 of the first semiconductor die 2110 to conductive contact pads 2124 disposed on a surface of the second semiconductor die 2120. The second semiconductor die 2120 may further include second inner interconnection lines 2123 that connect the second electrodes 2122 to the conductive contact pads 2124. Each of the plurality of dies constituting the second semiconductor die 2120 may have the same or substantially the same configuration as one another.

The side molded stacked die 2100 may include a mold layer 2190 that covers the sidewalls 2121S of the plurality of dies constituting the second semiconductor die 2120 stacked over the second surface 2115 of the first semiconductor die 2110. For example, the plurality of dies stacked on top of one another may be interleaved with the mold layer 2190. The mold layer 2190 may be an epoxy molding compound (EMC) material that is formed to cover the sidewalls 2121S of the second semiconductor die 2120 using a molding process. The mold layer 2190 may extend to fill spaces between the first semiconductor die 2110 and the plurality of dies constituting the second semiconductor die 2120. In some embodiments, an adhesive insulation material (not illustrated) may be disposed between the first semiconductor die 2110 and the plurality of dies constituting the second semiconductor die 2120 to improve an adhesive strength between the first semiconductor die 2110 and the second semiconductor die 2120.

The mold layer 2190 may cover the sidewalls 2121S of the second semiconductor die 2120 to expose a top surface 2218 of an uppermost die of the second semiconductor die 2120. That is, a top surface 2197 of the mold layer 2190 may be coplanar with the top surface 2218 of the second semiconductor die 2120. In such a case, heat generated in the side molded stacked die 2100 may be easily emitted through the exposed top surface 2218 of the second semiconductor die 2120. That is, the exposed top surface 2218 of the second semiconductor die 2120 may effectively dissipate heat from the side molded stacked die 2100.

The mold layer 2190 may be disposed to expose sidewalls 2117 of the first semiconductor die 2110. Outer sidewalls 2193 of the mold layer 2190 may be substantially parallel with the sidewalls 2121S of the second semiconductor die 2120. A distance between a vertical axis (not illustrated) passing through a central portion of the side molded stacked die 2100 and the outer sidewalls 2193 of the mold layer 2190 may be greater than a distance between the vertical axis (not shown) passing through a central portion of the side molded stacked die 2100 and the sidewalls 2117 of the first semiconductor die 2110. Thus, the mold layer 2190 may have horizontal surfaces 2191 that extend from lower portions of the outer sidewalls 2193 of the mold layer 2190 toward the sidewalls 2117 of the first semiconductor die 2110. Accordingly, the outer sidewalls 2193 of the mold layer 2190, the horizontal surfaces 2191 of the mold layer 2190, and the sidewalls 2117 of the first semiconductor die 2110 may constitute terrace-like edges T2. The horizontal surfaces 2191 of the mold layer 2190 may not overlap with the first semiconductor die 2110. Thus, the horizontal surfaces 2191 of the mold layer 2190 may be exposed when viewed from a bottom plan view.

The horizontal surfaces 2191 of the mold layer 2190 may be located at the same or substantially the same level as the second surface 2115 of the first semiconductor die 2110. Accordingly, the outer sidewalls 2193 and the horizontal surfaces 2191 of the mold layer 2190 may provide the terrace-like edges T2 which are located at lower corners of the side molded stacked die 2100.

As described with reference to FIGS. 1 and 5, a portion of the outer sidewall 2193 of the mold layer 2190 may contact the portion "C" of an inner surface of the sidewall portion (213 of FIG. 1) of the outer packaging part (200 of FIG. 1). Specifically, a corner E2 at which the outer sidewall 2193 and the horizontal surface 2191 of the mold layer 2190 meet and form an angle may be in contact with the inner surface of the sidewall portion (213 of FIG. 1) of the outer packaging part (200 of FIG. 1). In such a case, while edges of the first surface 2116 of the first semiconductor die 2110 are in contact with the die supporting portion (215 of FIG. 1) of the outer packaging part (200 of FIG. 1), the sidewalls 2117 of the first semiconductor die 2110 may be spaced apart from the sidewall portion (213 of FIG. 1) of the outer packaging part (200 of FIG. 1). Thus, a corner E1 at which the first surface 2116 and the sidewalls 2117 of the first semiconductor die 2110 meet and form an angle may be spaced apart from the sidewall portion (213 of FIG. 1) of the outer packaging part (200 of FIG. 1).

As described above, the side molded stacked die 2100 may include the terrace-like edges T2 which are located at lower corners thereof. Thus, the terrace-like edges T2 of the side molded stacked die 2100 may suppress or prevent the first semiconductor die 2110 from being damaged or broken while the side molded stacked die 2100 is transferred or kept using the outer packaging part (200 of FIG. 1). As a result, when an external force is applied to the outer packaging part 200 accommodating the side molded stacked die 2100, a frictional force or a shock concentrated on the first semiconductor die 2110 may be alleviated to protect the first semiconductor die 2110 from possible damage or to reduce particle generation.

Figure 7:
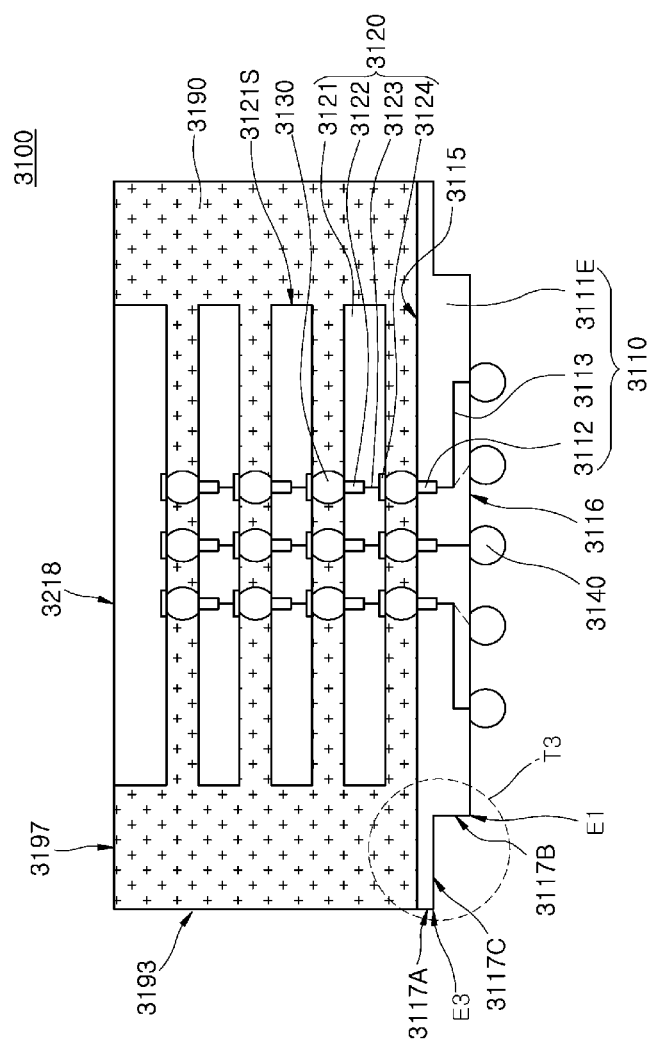
FIG. 7 is a cross-sectional view illustrating an example of a side molded stacked die included in a semiconductor package according to an embodiment.

FIG. 7 is a cross-sectional view illustrating an example of side molded stacked die 3100 included in a semiconductor package according to an embodiment.

Referring to FIG. 7, the side molded stacked die 3100 may be packaged by the carrier tape (210 of FIG. 1) of the outer packaging part (200 of FIG. 1) to provide a semiconductor package. The side molded stacked die 3100 may include a plurality of semiconductor dies 3110 and 3120 which are stacked. The plurality of semiconductor dies 3110 and 3120 may be electrically connected to each other by electrodes 3112 and 3122. The electrodes 3112 and 3122 may be electrodes that pass through the semiconductor dies 3110 and 3120, respectively. The first semiconductor die 3110 may have a width greater than a width of the second semiconductor die 3120 stacked over the first semiconductor die 3110. Thus, edges 3111E of the first semiconductor die 3110 may laterally protrude from sidewalls 3121S of the second semiconductor die 3120.

The first semiconductor die 3110 may have a different function from a function of the second semiconductor die 3120. The second semiconductor die 3120 may include a plurality of semiconductor dies vertically stacked over the first semiconductor die 3110. For example, the plurality of semiconductor dies may be stacked on top of one another interleaved with insulating layers. The plurality of semiconductor dies constituting the second semiconductor die 3120 may have the same or substantially the same function as one another. A stack structure of the first semiconductor die 3110 and the second semiconductor die 3120 may constitute a single memory semiconductor device, for example, a high bandwidth memory (HBM) device.

The first semiconductor die 3110 may include the external connectors 3140 for connecting the side molded stacked die 3100 to an external device. The external connectors 3140 may be disposed on a first surface 3116 of a body of the first semiconductor die 3110. The first semiconductor die 3110 may include the first electrodes 3112, which connect the first semiconductor die 3110 to the second semiconductor die 3120, and first inner interconnection lines 3113, which connect the first electrodes 3112 to the external connectors 3140. The first electrodes 3112 may be disposed in a portion of the first semiconductor die 3110. In contrast, the external connectors 3140 may be uniformly disposed on an entire surface of the first surface 3116 of the first semiconductor die 3110, as described with reference to FIG. 4. The first inner interconnection lines 3113 may be disposed to electrically connect the first electrodes 3112 to the external connectors 3140.

The second semiconductor die 3120 may be disposed over a second surface 3115 of the first semiconductor die 3110 opposite to the external connectors 3140, and the plurality of dies constituting the second semiconductor die 3120 may be electrically connected to the first electrodes 3112 of the first semiconductor die 3110 by inner connectors 3130 disposed between the plurality of dies constituting the second semiconductor die 3120 as well as between the first semiconductor die 3110 and the second semiconductor die 3120. Examples of the inner connectors 3130 may include micro bumps that connect the first electrodes 3112 of the first semiconductor die 3110 to conductive contact pads 3124 disposed on a surface of the second semiconductor die 3120. The second semiconductor die 3120 may further include second inner interconnection lines 3123 that connect the second electrodes 3122 to the conductive contact pads 3124. Each of the plurality of dies constituting the second semiconductor die 3120 may have the same or substantially the same configuration as one another.

The side molded stacked die 3100 may include a mold layer 3190 that covers the sidewalls 3121S of the plurality of dies constituting the second semiconductor die 3120 stacked over the second surface 3115 of the first semiconductor die 3110. For example, the plurality of dies stacked on top of one another may be interleaved with the mold layer 3190. The mold layer 3190 may be an epoxy molding compound (EMC) material that is formed to cover the sidewalls 3121S of the second semiconductor die 3120 using a molding process. The mold layer 3190 may extend to fill spaces between the first semiconductor die 3110 and the plurality of dies constituting the second semiconductor die 3120. In some embodiments, an adhesive insulation material (not illustrated) may be disposed between the first semiconductor die 3110 and the plurality of dies constituting the second semiconductor die 3120 to improve an adhesive strength between the first semiconductor die 3110 and the second semiconductor die 3120.

The mold layer 3190 may cover the sidewalls 3121S of the second semiconductor die 3120 to expose a top surface 3218 of an uppermost die of the second semiconductor die 3120. That is, a top surface 3197 of the mold layer 3190 may be coplanar with the top surface 3218 of the second semiconductor die 3120. In such a case, heat generated in the side molded stacked die 3100 may be easily emitted through the exposed top surface 3218 of the second semiconductor die 3120. That is, the exposed top surface 3218 of the second semiconductor die 3120 may effectively dissipate heat from the side molded stacked die 3100.

The mold layer 3190 may be disposed to expose outer sidewalls 3117A of the first semiconductor die 3110. The outer sidewalls 3117A of the first semiconductor die 3110 may downwardly extend from outer sidewalls 3193 of the mold layer 3190. That is, the outer sidewalls 3117A of the first semiconductor die 3110 may be vertically aligned with the outer sidewalls 3193 of the mold layer 3190. The outer sidewalls 3193 of the mold layer 3190 may be substantially parallel with the sidewalls 3121S of the second semiconductor die 3120. The first semiconductor die 3110 may also have inner sidewalls 3117B that are laterally recessed from the outer sidewalls 3117A of the first semiconductor die 3110 toward a central portion of the first semiconductor die 3110. Thus, the first semiconductor die 3110 may have horizontal surfaces 3117C that laterally extend from lower portions of the outer sidewalls 3117A of the first semiconductor die 3110 toward the inner sidewalls 3117B of the first semiconductor die 3110. Accordingly, the outer sidewalls 3117A, the horizontal surfaces 3117C, and the inner sidewalls 3117B of the first semiconductor die 3110 may constitute terrace-like edges T3.

As described with reference to FIGS. 1 and 5, a portion of the outer sidewall 3193 of the mold layer 3190 or a portion of the outer sidewall 3117A of the first semiconductor die 3110 may contact the portion "C" of an inner surface of the sidewall portion (213 of FIG. 1) of the outer packaging part (200 of FIG. 1). Specifically, a corner E3 at which the outer sidewall 3117A and the horizontal surface 3117C of the first semiconductor die 3110 meet and form an angle may be in contact with the inner surface of the sidewall portion (213 of FIG. 1) of the outer packaging part (200 of FIG. 1). In such a case, while the outer sidewall 3117A of the first semiconductor die 3110 is in contact with the sidewall portion (213 of FIG. 1) of the outer packaging part (200 of FIG. 1), the horizontal surface 3117C of the first semiconductor die 3110 may be spaced apart from the die supporting portion (215 of FIG. 1) of the outer packaging part (200 of FIG. 1). That is, the corner E3 of the first semiconductor die 3110 may be spaced apart from the die supporting portion (215 of FIG. 1). In addition, the inner sidewalls 3117B of the first semiconductor die 3110 may also be spaced apart from the sidewall portion (213 of FIG. 1) of the outer packaging part (200 of FIG. 1). Thus, a corner E1 at which the inner sidewall 3117B and the first surface 3116 of the first semiconductor die 3110 meet and form an angle may be spaced apart from the sidewall portion (213 of FIG. 1) of the outer packaging part (200 of FIG. 1). Accordingly, a contact area between the first semiconductor die 110 and the outer packaging part 200 may be reduced to alleviate a frictional force or a shock concentrated on the first semiconductor die 3110 when an external force is applied to the outer packaging part 200 accommodating the side molded stacked die 3100. The side molded stacked die 3100 may include the terrace-like edges T3 which are located at lower corners thereof. Thus, the terrace-like edges T3 of the side molded stacked die 3100 may suppress or prevent the first semiconductor die 3110 from being damaged or broken while the side molded stacked die 3100 is transferred or kept using the outer packaging part (200 of FIG. 1). As a result, when an external force is applied to the outer packaging part 200 accommodating the side molded stacked die 3100, a frictional force or a shock concentrated on the first semiconductor die 3110 may be alleviated to prevent the first semiconductor die 3110 from being damaged or to prevent particles from being generated.

Figure 8:
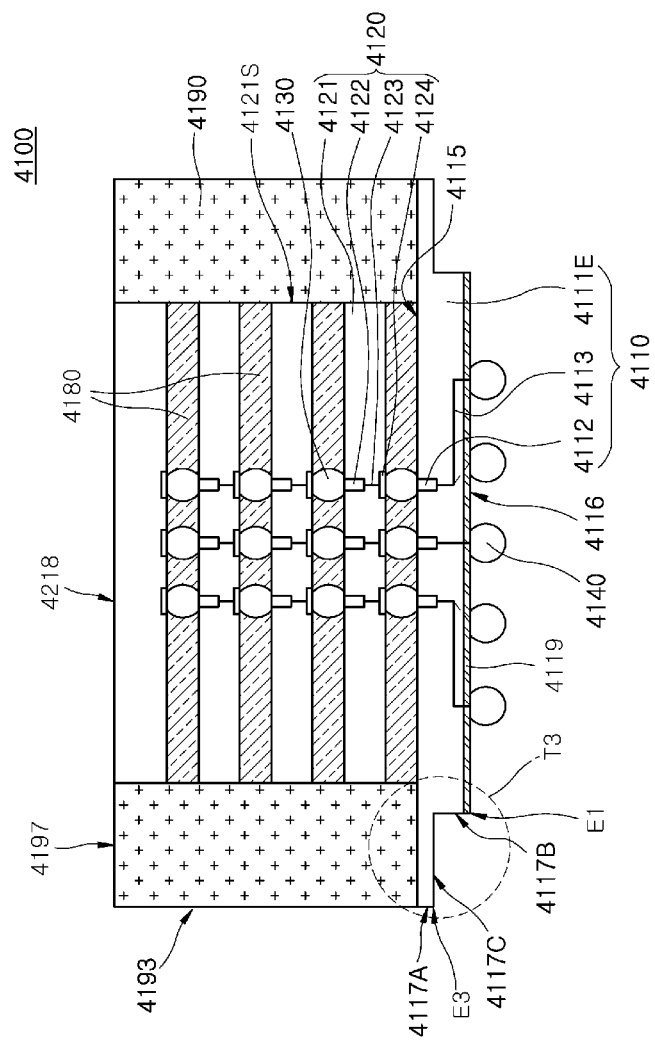
FIG. 8 is a cross-sectional view illustrating an example of a side molded stacked die included in a semiconductor package according to an embodiment.

FIG. 8 is a cross-sectional view illustrating an example of side molded stacked die 4100 included in a semiconductor package according to an embodiment.

Referring to FIG. 8, the side molded stacked die 4100 may be packaged by the carrier tape (210 of FIG. 1) of the outer packaging part (200 of FIG. 1) to provide a semiconductor package. The side molded stacked die 4100 may include a plurality of semiconductor dies 4110 and 4120 which are stacked. The plurality of semiconductor dies 4110 and 4120 may be electrically connected to each other by electrodes 4112 and 4122. The electrodes 4112 and 4122 may be electrodes that pass through the semiconductor dies 4110 and 4120, respectively. The first semiconductor die 4110 may have a width which is greater than a width of the second semiconductor die 4120 stacked on the first semiconductor die 4110. Thus, edges 4111E of the first semiconductor die 4110 may laterally protrude from sidewalls 4121S of the second semiconductor die 4120.

The first semiconductor die 4110 may have a different function from a function of the second semiconductor die 4120. The second semiconductor die 4120 may include a plurality of semiconductor dies vertically stacked over the first semiconductor die 4110. For example, the plurality of semiconductor dies may be stacked on top of one another interleaved with insulating layers. The plurality of semiconductor dies constituting the second semiconductor die 4120 may have the same or substantially the same function as one another. A stack structure of the first semiconductor die 4110 and the second semiconductor die 4120 may constitute a single memory semiconductor device, for example, a high bandwidth memory (HBM) device.

The first semiconductor die 4110 may include the external connectors 4140 for connecting the side molded stacked die 4100 to an external device. The external connectors 4140 may be disposed on a first surface 4116 of a body of the first semiconductor die 4110. The first surface 4116 of the first semiconductor die 4110 may be covered with a passivation layer 4119. In such a case, the external connectors 4140 may be disposed on the passivation layer 4119. The passivation layer 4119 may include a silicon nitride layer, a silicon oxide layer, or a combination of a silicon nitride layer, and a silicon oxide layer.

The first semiconductor die 4110 may include the first electrodes 4112, which connect the first semiconductor die 4110 to the second semiconductor die 4120, and first inner interconnection lines 4113, which connect the first electrodes 4112 to the external connectors 4140. The first electrodes 4112 may be disposed in a portion of the first semiconductor die 4110. In contrast, the external connectors 4140 may be uniformly disposed on an entire surface of the first surface 4116 of the first semiconductor die 4110, as described with reference to FIG. 4. The first inner interconnection lines 4113 may be disposed to electrically connect the first electrodes 4112 to the external connectors 4140.

The second semiconductor die 4120 may be disposed over a second surface 4115 of the first semiconductor die 4110 opposite to the external connectors 4140, and the plurality of dies constituting the second semiconductor die 4120 may be electrically connected to the first electrodes 4112 of the first semiconductor die 4110 by inner connectors 4130 disposed between the plurality of dies constituting the second semiconductor die 4120 as well as between the first semiconductor die 4110 and the second semiconductor die 4120. An adhesive layer 4180 may be disposed between the first semiconductor die 4110 and the second semiconductor die 4120. Specifically, the adhesive layer 4180 may be disposed between the first semiconductor die 4110 and the plurality of dies constituting the second semiconductor die 4120. The adhesive layer 4180 may include a non-conductive film (NCF).

The inner connectors 4130 disposed between two adjacent dies among the first semiconductor die 4110 and the plurality of dies constituting the second semiconductor die 4120 may be separated and isolated from each other by the adhesive layer 4180. The inner connectors 4130 may be micro bumps that connect the first electrodes 4112 of the first semiconductor die 4110 to conductive contact pads 4124 disposed on a surface of the second semiconductor die 4120. The second semiconductor die 4120 may further include second inner interconnection lines 4123 that connect the second electrodes 4122 to the conductive contact pads 4124. Each of the plurality of dies constituting the second semiconductor die 4120 may have the same or substantially the same configuration.

The side molded stacked die 4100 may include a mold layer 4190 that covers the sidewalls 4121S of the plurality of dies constituting the second semiconductor die 4120 stacked on the second surface 4115 of the first semiconductor die 4110. The mold layer 4190 may also cover sidewalls of the adhesive layer 4180 disposed between the first semiconductor die 4110 and the second semiconductor die 4120. The mold layer 4190 may be an epoxy molding compound (EMC) material that is formed to cover the sidewalls 4121S of the second semiconductor die 4120 using a molding process. The mold layer 4190 may cover the sidewalls 4121S of the second semiconductor die 4120 to expose a top surface 4218 of an uppermost die of the second semiconductor die 4120. That is, a top surface 4197 of the mold layer 4190 may be coplanar with the top surface 4218 of the second semiconductor die 4120. In such a case, heat generated in the side molded stacked die 4100 may be easily emitted through the exposed top surface 4218 of the second semiconductor die 4120. That is, the exposed top surface 4218 of the second semiconductor die 4120 may effectively dissipate heat from the side molded stacked die 4100.

The mold layer 4190 may be disposed to expose outer sidewalls 4117A of the first semiconductor die 4110. The outer sidewalls 4117A of the first semiconductor die 4110 may downwardly extend from outer sidewalls 4193 of the mold layer 4190. That is, the outer sidewalls 4117A of the first semiconductor die 4110 may be vertically aligned with the outer sidewalls 4193 of the mold layer 4190. The outer sidewalls 4193 of the mold layer 4190 may be substantially parallel with the sidewalls 4121S of the second semiconductor die 4120. The first semiconductor die 4110 may also have inner sidewalls 4117B that are laterally recessed from the outer sidewalls 4117A of the first semiconductor die 4110 toward a central portion of the first semiconductor die 4110. Thus, the first semiconductor die 4110 may have horizontal surfaces 4117C that laterally extend from lower portions of the outer sidewalls 4117A of the first semiconductor die 4110 toward the inner sidewalls 4117B of the first semiconductor die 4110. Accordingly, the outer sidewalls 4117A, the horizontal surfaces 4117C, and the inner sidewalls 4117B of the first semiconductor die 4110 may constitute terrace-like edges T3. The inner sidewalls 4117B and the horizontal surfaces 4117C of the first semiconductor die 4110 may correspond to surfaces of a substrate body (e.g., a silicon body) of the first semiconductor die 4110. Accordingly, portions of the silicon body of the first semiconductor die 4110 may be exposed. In contrast, the first surface 4116 of the first semiconductor die 4110 may be covered with the passivation layer 4119. The passivation layer 4119 does not extend onto the inner sidewalls 4117B and the horizontal surfaces 4117C of the first semiconductor die 4110. Thus, sidewalls of the edges 4111E of the first semiconductor die 4110 may be exposed.

As described with reference to FIGS. 1 and 5, a portion of the outer sidewall 4193 of the mold layer 4190 or a portion of the outer sidewall 4117A of the first semiconductor die 4110 may contact the portion "C" of an inner surface of the sidewall portion (213 of FIG. 1) of the outer packaging part (200 of FIG. 1). Specifically, a corner E3 at which the outer sidewall 4117A and the horizontal surface 4117C of the first semiconductor die 4110 meet and form an angle may be in contact with the inner surface of the sidewall portion (213 of FIG. 1) of the outer packaging part (200 of FIG. 1). In such a case, while the outer sidewall 4117A of the first semiconductor die 4110 is in contact with the sidewall portion (213 of FIG. 1) of the outer packaging part (200 of FIG. 1), the horizontal surface 4117C of the first semiconductor die 4110 may be spaced apart from the die supporting portion (215 of FIG. 1) of the outer packaging part (200 of FIG. 1). That is, the corner E3 of the first semiconductor die 4110 may be spaced apart from the die supporting portion (215 of FIG. 1). In addition, the inner sidewalls 4117B of the first semiconductor die 4110 may also be spaced apart from the sidewall portion (213 of FIG. 1) of the outer packaging part (200 of FIG. 1). Thus, a corner E1 at which the inner sidewall 4117B and the first surface 4116 of the first semiconductor die 4110 meet and form an angle may be spaced apart from the sidewall portion (213 of FIG. 1) of the outer packaging part (200 of FIG. 1). In addition, the passivation layer 4119 may prevent the corner E1 of the first semiconductor die 4110 from being in direct contact with the outer packaging part 200. As a result, the passivation layer 4119 may not be peeled from the silicon body of the first semiconductor die 4110 at the corner E1 of the first semiconductor die 4110. The terrace-like edges T3 of the side molded stacked die 4100 may suppress or prevent the first semiconductor die 4110 from being damaged or broken while the side molded stacked die 4100 is transferred or kept using the outer packaging part (200 of FIG. 1). As a result, when an external force is applied to the outer packaging part 200 accommodating the side molded stacked die 4100, a frictional force or a shock concentrated on the first semiconductor die 4110 may be alleviated to prevent the first semiconductor die 4110 from being damaged or particles are generated.

Figure 9:
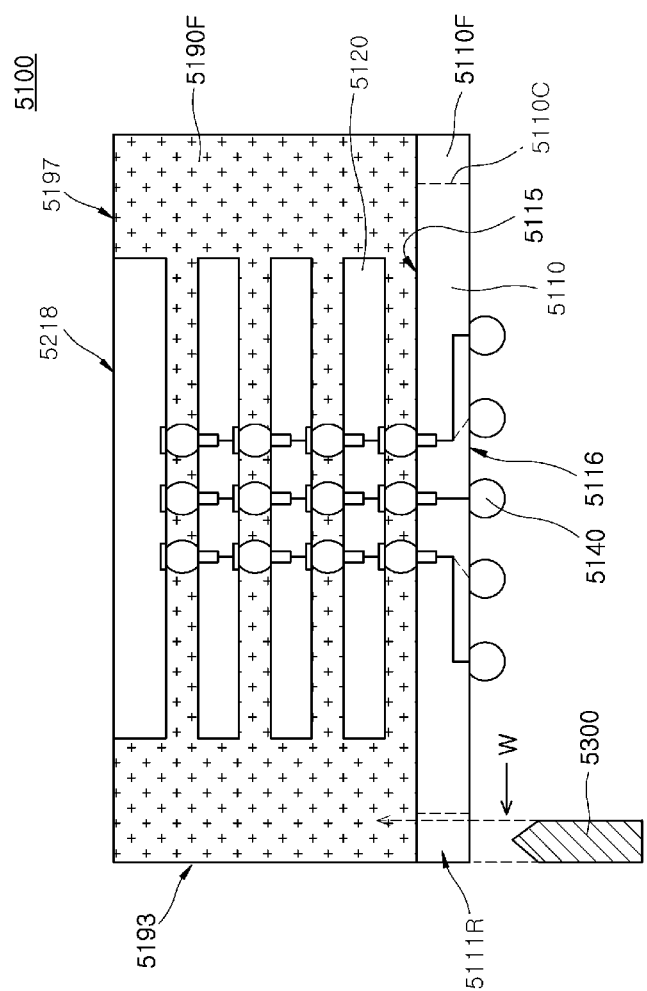
FIGS. 9 and 10 are cross-sectional views illustrating an example of a method of forming terrace-shaped edges of a side molded stacked die included in a semiconductor package according to an embodiment.
Figure 10:
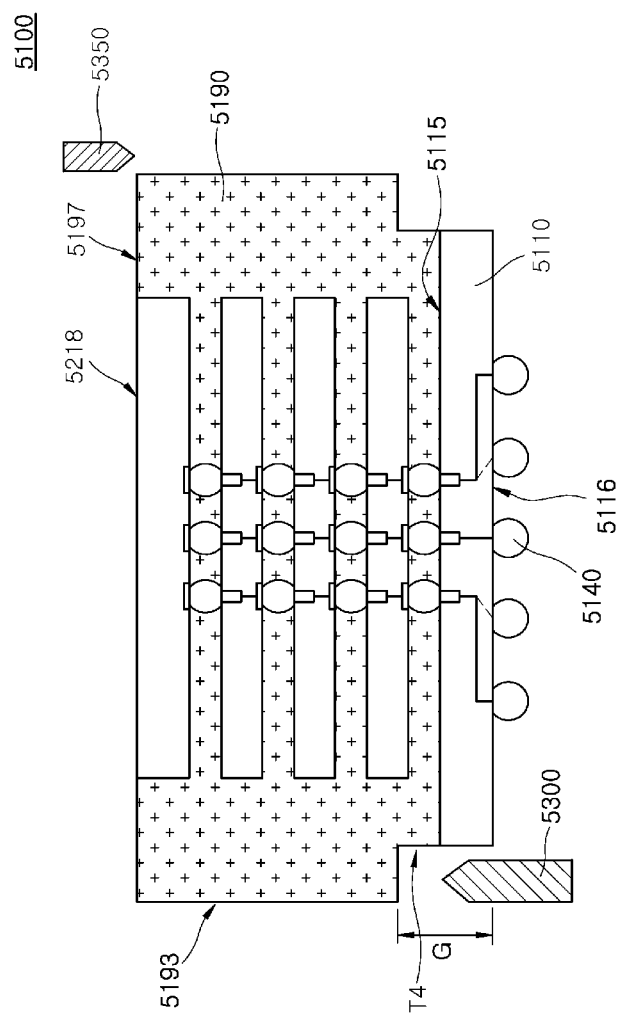

FIGS. 9 and 10 are cross-sectional views illustrating an example of a method of forming terrace-shaped edges of a side molded stacked die included in a semiconductor package according to an embodiment.

Referring to FIG. 9, in order to form a side molded stacked die 5100, a first semiconductor wafer 5110F having an edge boundary region 5111R corresponding to a scribe lane between first semiconductor die regions 5110C may be provided. First semiconductor dies 5110 including semiconductor integrated circuits may be realized in the first semiconductor die regions 5110C of the first semiconductor wafer 5110F, respectively. A plurality of second semiconductor dies 5120 may be vertically stacked over a second surface 5115 of each of the first semiconductor die regions 5110C of the first semiconductor wafer 5110F. The plurality of second semiconductor dies 5120 may be vertically stacked over each of the first semiconductor die regions 5110C of the first semiconductor wafer 5110F using a chip on wafer (CoW) technique to provide a stack die structure. Accordingly, a plurality of stack die structures are disposed side by side on the first semiconductor wafer 5110F.

A mold material may be deposited on the second surface 5115 of the first semiconductor wafer 5110F to cover the plurality of stack die structures. The mold material may then be recessed to form a mold layer 5190F that exposes a top surface 5218 of an uppermost die of the stacked second semiconductor dies 5120. In such a case, a top surface 5197 of the mold layer 5190F may be coplanar with the top surface 5218 of the uppermost die of the stacked second semiconductor dies 5120. Thus, the stack die structures molded by the mold layer 5190F may be formed on the first semiconductor wafer 5110F. External connectors 5140 may be attached to a first surface 5116 of the first semiconductor wafer 5110F. Before the first semiconductor wafer 5110F is divided into a plurality of pieces corresponding to form a plurality of side molded stacked dies 5100, terrace-like edges (T1 of FIG. 1) may be formed.

Referring to FIGS. 9 and 10, a first blade 5300 may be provided and may be aligned such that an end of the first blade 5300 faces the first surface 5116 of the first semiconductor wafer 5110F. The edge boundary region 5111R may be removed using the first blade 5300, and a portion of the mold layer 5190F adjacent to the edge boundary region 5111R may also be removed using the first blade 5300 to form a trench T4 providing the terrace-like edges (T1 of FIG. 1, T2 of FIG. 6 or T3 of FIG. 7). A depth G of the trench T4 may be controlled according to a desired feature of the terrace-like edges (T1 of FIG. 1, T2 of FIG. 6 or T3 of FIG. 7). After the trench T4 is formed, a second blade 5350 may be provided on the top surface 5197 of the mold layer 5190F. The mold layer 5190F on the trench T4 may be removed using the second blade 5350 to form the plurality of side molded stacked dies 5100 which are separated from each other. As a result, the mold layer 5190F of each side molded stacked die 5100 may be formed to have outer sidewalls 5193 which are exposed. That is, the first semiconductor wafer 5110F and the mold layer 5190F may be divided into a plurality of pieces using the first and second blades 5300 and 5350 to form the plurality of side molded stacked dies 5100 which are separated from each other. A width W of the first blade 5300 may be different from a width of the second blade 5300.

Figure 11:
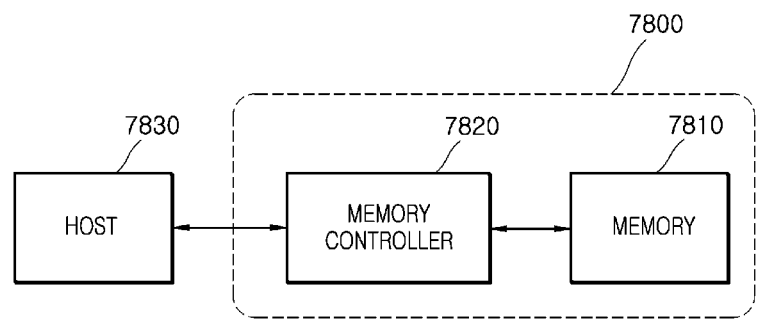
FIG. 11 is a block diagram illustrating an example of an electronic system employing a memory card including a package according to an embodiment.

FIG. 11 is a block diagram illustrating an example of an electronic system including a memory card 7800. The memory card 7800 may include at least one semiconductor die. For example, the semiconductor package in accordance with an embodiment may be provided in a form of a memory card. Alternatively, the memory card 7800 may include at least one semiconductor package according to an embodiment. The memory card 7800 may include a memory 7810 such as a nonvolatile memory device, and a memory controller 7820. The memory 7810 and the memory controller 7820 may store data or read stored data. The memory 7810 and/or the memory controller 7820 may include at least one semiconductor package according to an embodiment.

The memory 7810 may include a nonvolatile memory device to which the technology of the embodiments of the present invention is applied. The memory controller 7820 may control the memory 7810 such that stored data is read out or data is stored in response to a read/write request from a host 7830.

Figure 12:
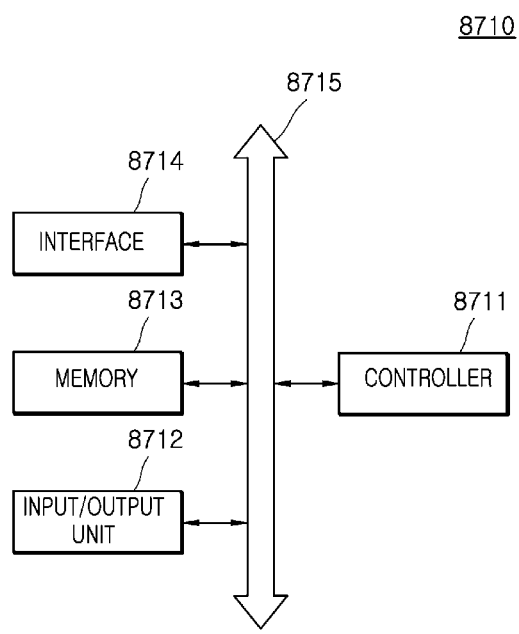
FIG. 12 is a block diagram illustrating an example of an electronic system including a package according to an embodiment.

FIG. 12 is a block diagram illustrating an example of an electronic system 8710 including at least one package according to an embodiment. The electronic system 8710 may include a controller 8711, an input/output device 8712, and a memory 8713. The controller 8711, the input/output device 8712 and the memory 8713 may be coupled to one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected between a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be a component of an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 which transmits and receives data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a first semiconductor die;
   external connectors disposed over a first surface of the first semiconductor die;
   second semiconductor dies stacked over a second surface of the first semiconductor die;
   a mold layer covering sidewalls of the second semiconductor dies;
   an outer packaging part having a groove in which a stack structure of the first and second semiconductor dies are accommodated; and
   a terrace-like edge disposed under an edge of the mold layer to expose a sidewall of the first semiconductor die,
   wherein a portion of an outer sidewall of the mold layer is in contact with a portion of an inner surface of the outer packaging part, and
   wherein the inner surface of the outer packaging part is spaced apart from the sidewall of the first semiconductor die by the terrace-like edge.

2. The semiconductor package of claim 1, wherein the outer packaging part includes:
   a carrier tape providing an accommodating groove in which the stack structure of the first and second semiconductor dies are put; and
   a cover tape attached to an upper portion of the carrier tape to seal the accommodating groove,
   wherein the carrier tape comprises:
      a connector housing providing a first space in which the external connectors are put;
      a die supporting portion horizontally and outwardly extending from an upper portion of the connector housing; and
      a sidewall portion vertically and upwardly extending from edges of the die supporting portion to provide a second space in which the first and second semiconductor dies and the mold layer are put, the sidewall portion of the carrier tape being spaced apart from the sidewall of the first semiconductor die, and a portion of the sidewall portion of the carrier tape being in contact with a portion of the outer sidewall of the mold layer.

3. The semiconductor package of claim 1, wherein:
   the sidewall of the first semiconductor die is laterally recessed from the outer sidewall of the mold layer toward a central portion of the first semiconductor die;
   the terrace-like edge exposes a horizontal surface of the mold layer adjacent to the sidewall of the first semiconductor die; and
   the horizontal surface of the mold layer, the outer sidewall of the mold layer, and the sidewall of the first semiconductor die constitute the terrace-like edge.

4. The semiconductor package of claim 1, wherein:
   the sidewall of the first semiconductor die is laterally recessed from the outer sidewall of the mold layer toward a central portion of the first semiconductor die and is vertically aligned with an inner sidewall of the mold layer adjacent to the first semiconductor die;
   the terrace-like edge exposes a horizontal surface of the mold layer between the outer sidewall and the inner sidewall of the mold layer; and
   the horizontal surface of the mold layer, the outer sidewall of the mold layer, the inner sidewall of the mold layer, and the sidewall of the first semiconductor die constitute the terrace-like edge.

5. The semiconductor package of claim 1, wherein the sidewall of the first semiconductor die includes:
   an outer sidewall vertically aligned with the outer sidewall of the mold layer;
   an inner sidewall laterally recessed from the outer sidewall of the first semiconductor die toward a central portion of the first semiconductor die to be spaced apart from the outer sidewall of the first semiconductor die; and a horizontal surface between the outer sidewall and the inner sidewall of the first semiconductor die, wherein the inner sidewall of the first semiconductor die, the horizontal surface of the first semiconductor die, and the outer sidewall of the first semiconductor die constitute the terrace-like edge.

6. The semiconductor package of claim 1, wherein the first semiconductor die is electrically connected to a lowermost die of the second semiconductor dies by electrodes passing through the first semiconductor die.

7. The semiconductor package of claim 1, wherein the first and second semiconductor dies are electrically connected to each other by electrodes passing through the first and second semiconductor dies, respectively.

8. The semiconductor package of claim 1, wherein edges of the first semiconductor die laterally protrude from the sidewalls of the second semiconductor dies.

9. The semiconductor package of claim 1, wherein the first and second semiconductor dies constitute a high bandwidth memory (HBM) device.

10. The semiconductor package of claim 1, wherein the mold layer exposes a top surface of an uppermost die of the second semiconductor dies.

11. A semiconductor package comprising:
a first semiconductor die;
external connectors disposed over a first surface of the first semiconductor die;
second semiconductor dies stacked over a second surface of the first semiconductor die;
a mold layer covering sidewalls of the second semiconductor dies; and
a terrace-like edge disposed under an edge of the mold layer to expose a sidewall of the first semiconductor die.

12. The semiconductor package of claim 11, wherein the first semiconductor die is electrically connected to a lowermost die of the second semiconductor dies by electrodes passing through the first semiconductor die.

13. The semiconductor package of claim 11, wherein the first and second semiconductor dies are electrically connected to each other by electrodes passing through the first and second semiconductor dies, respectively.

14. The semiconductor package of claim 11, wherein edges of the first semiconductor die laterally protrude from the sidewalls of the second semiconductor dies.

15. The semiconductor package of claim 11, wherein the first and second semiconductor dies constitute a high bandwidth memory (HBM) device.

16. The semiconductor package of claim 11, wherein the mold layer exposes a top surface of an uppermost die of the second semiconductor dies.

17. The semiconductor package of claim 11, wherein:
the sidewall of the first semiconductor die is laterally recessed from the outer sidewall of the mold layer toward a central portion of the first semiconductor die;
the terrace-like edge exposes a horizontal surface of the mold layer adjacent to the sidewall of the first semiconductor die; and
the horizontal surface of the mold layer, the outer sidewall of the mold layer, and the sidewall of the first semiconductor die constitute the terrace-like edge.

18. The semiconductor package of claim 11, wherein:
the sidewall of the first semiconductor die is laterally recessed from the outer sidewall of the mold layer toward a central portion of the first semiconductor die and is vertically aligned with an inner sidewall of the mold layer adjacent to the first semiconductor die;
the terrace-like edge exposes a horizontal surface of the mold layer between the outer sidewall and the inner sidewall of the mold layer; and
the horizontal surface of the mold layer, the outer sidewall of the mold layer, the inner sidewall of the mold layer, and the sidewall of the first semiconductor die constitute the terrace-like edge.

19. The semiconductor package of claim 11, wherein the sidewall of the first semiconductor die includes:
an outer sidewall vertically aligned with the outer sidewall of the mold layer;
an inner sidewall laterally recessed from the outer sidewall of the first semiconductor die toward a central portion of the first semiconductor die to be spaced apart from the outer sidewall of the first semiconductor die; and
a horizontal surface between the outer sidewall and the inner sidewall of the first semiconductor die,
wherein the inner sidewall of the first semiconductor die, the horizontal surface of the first semiconductor die, and the outer sidewall of the first semiconductor die constitute the terrace-like edge.

* * * * *